(12) United States Patent
Haase et al.

(10) Patent No.: US 9,407,219 B2
(45) Date of Patent: Aug. 2, 2016

(54) ELECTRONIC CIRCUIT

(71) Applicant: Endress + Hauser Conducta Gesellschaft für Mess-und Regeltechnik mbH + Co. KG, Gerlingen (DE)

(72) Inventors: Bjorn Haase, Stuttgart (DE); Stefan Pilz, Geithain (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 2 days.

(21) Appl. No.: 14/048,152

(22) Filed: Oct. 8, 2013

(65) Prior Publication Data

US 2014/0097898 A1 Apr. 10, 2014

(30) Foreign Application Priority Data

Oct. 29, 2012 (DE) .......................... 10 2012 110 310

(51) Int. Cl.
*H03F 3/26* (2006.01)
*H03F 3/45* (2006.01)
*H03F 3/217* (2006.01)

(52) U.S. Cl.
CPC ............ *H03F 3/45179* (2013.01); *H03F 3/217* (2013.01)

(58) Field of Classification Search
CPC ....................................................... H03F 3/26
USPC .................................. 330/265, 103, 255, 267
See application file for complete search history.

(56) References Cited

U.S. PATENT DOCUMENTS

| | | | | |
|---|---|---|---|---|
| 4,453,132 A * | 6/1984 | Stamler | .......................... | 330/107 |
| 7,061,313 B2 * | 6/2006 | Kimball et al. | ................ | 330/103 |
| 7,279,970 B2 * | 10/2007 | Yokoyama et al. | ............. | 330/99 |
| 8,421,531 B2 * | 4/2013 | Jones et al. | ...................... | 330/98 |
| 8,482,351 B2 * | 7/2013 | Hou | ............................... | 330/255 |
| 2005/0253649 A1 | 11/2005 | Morishima | | |
| 2007/0079710 A1 * | 4/2007 | Ishizaki | ......................... | 101/189 |
| 2011/0002486 A1 * | 1/2011 | Ishizaki | ......................... | 381/190 |

FOREIGN PATENT DOCUMENTS

DE 2407629 A1 8/1975

OTHER PUBLICATIONS

Jun. 20, 2013 German Search Report, German Patent Office, Munich, Germany.

* cited by examiner

*Primary Examiner* — Henry Choe
(74) *Attorney, Agent, or Firm* — Christopher R. Powers; PetServe

(57) ABSTRACT

An electronic circuit for amplifying a wanted signal, comprising: a comparator having a first input, a second input and an output, wherein a connection is provided, which leads the wanted signal to the first input; a first driver stage comprising an input and an output, wherein the first driver stage includes at least a first push pull end stage; a low-pass filter having an input and an output, wherein the output of the first driver stage leads to the input of the low pass filter; a first feedback network; and a second feedback network.

17 Claims, 3 Drawing Sheets

ELECTRONIC CIRCUIT

TECHNICAL FIELD

The invention relates to an electronic circuit for amplifying a wanted signal.

BACKGROUND DISCUSSION

The problem to which the invention is directed will be explained based on signal transmission between a sensor unit and a superordinated unit, e.g. a measurement transmitter. The field of application can, however, be expanded to general systems, in the case of which signals, especially also power, is transmitted and amplified.

Usually connected to a measurement transmitter is a cable leading to a sensor-containing element, e.g. a sensor, in general, a peripheral device. The connection to a sensor element occurs frequently via a plugged connection, for example, through a galvanically decoupled, especially an inductive, interface. Thus, electrical signals can be transmitted contactlessly. This galvanic isolation provides advantages as regards corrosion protection, voltage isolation, avoiding mechanical wear of a plug, etc.

The inductive interface is usually embodied as a system with two coils, which are, for example, plugged into one another. Typically, the signals applied to the coils transmit both data and energy. The energy must, in such case, be sufficiently large that a sensor-containing element, in general a peripheral device, connected to the plug is supplied sufficiently with energy and, thus, a lasting measurement operation is assured.

For operating the coil connected to the measurement transmitter, sufficient power must be provided. The relevant power range is around 30 mW. In the case of operation of the system from an industry-usual, 4.20 mA electrical current loop with a total-energy budget of e.g. about 30 mW, the efficiency of the system components is a decisive factor.

Usually, digital signals are sent from the measurement transmitter and forwarded via the inductive interface to the peripheral device as an amplitude modulated signal. The amplitude modulation can occur, for example, by generating the coil signals via an oscillatory circuit, which is fed from a variable DC supply voltage. If this DC voltage is increased or decreased as a function of the data signals, then, in the case of suitable design of the oscillatory circuit, the coil voltage of the transmission system can be increased or decreased as a function of the data signals, respectively an amplitude modulation of the coil signals can be implemented.

In a simple implementation, the digital signal is, first of all, converted into an analog signal, which, in the case of a high level (thus a digital "1"), assumes a certain voltage and, in the case of a low level (thus a digital "0"), assumes a voltage around e.g. 10% smaller. This analog signal could be amplified in a linear amplifier, at whose output this voltage is available with a sufficient power, in order therewith lastly to supply the peripheral device with power.

In the case of this type of linear amplifier, a number of integrated circuits are commercially available for the power region of about 20 mW, e.g. a number of operational amplifiers have output transistors capable of providing power of about 30 mW.

The deciding disadvantage in the case of application of a linear amplifier is that those using so-called A-, B- or AB-topologies have poor efficiencies, because the energy available in excess voltage levels is converted in power transistors of the output stage into heat.

For applications, in the case of which high powers are required, e.g. in the case of 200 W audio amplifiers for HIFI applications, where, accordingly also considerable heat generation in the power transistors must be taken into consideration, methods for improving the efficiency are applied. A known method for improving the efficiency is to drive the power transistors no longer in linear operation, but, instead, to utilize switching transistors. This principle is used e.g. in the case of so-called class-D amplifiers.

A class-D amplifier can usually be subdivided into three regions.

The first region is composed of a stage with an input for the wanted signal, which converts the wanted signal into a pulse width modulated signal. Usually this occurs by using a signal generator and a comparator. The comparator compares, first of all, the wanted signal with the comparison signal generated by the signal generator, frequently a triangular signal. The comparator switches its output dependent on which of the two signals has a higher voltage. The result of this so-called pulse width modulation (PWM) is a rectangular signal with different pulse widths and the same frequency as the comparison signal. The pulse widths map the information concerning amplitude and frequency of the audio signal.

In the second region, the PWM signal coming from the comparator is amplified by an amplifier.

The third region is formed by a low-pass filter, which filters out the PWM frequencies.

In the state of the art, in the usual case of application of this technology, the power analog electronics is operated with a power transmission of above 100 mW. The main goal is, in such case, the preventing of power loss and therewith the avoidance of cooling measures. Integrated circuits for the power region above 100 mW are commercially available.

Since, in a power region around 30 mW, cooling measures can be omitted, there is, as a rule, no demand for an improved efficiency, so that energy efficient integrated circuits for this application are not commercially available.

SUMMARY OF THE INVENTION

An object of the invention, therefore, is to provide an amplifier circuit with high efficiency, which is able to drive a power of about 30 mW and makes use exclusively of commercially available, standard ICs.

The object is achieved by an electronic circuit, comprising
a comparator having a first input, a second input and an output, wherein a connection is provided, which leads the wanted signal to the first input;
at least a first driver stage comprising an input and an output, wherein the first driver stage includes at least a first push pull end stage, wherein the output of the comparator leads to the input of the first driver stage;
a low-pass filter with an input and an output, wherein the output of the first driver stage leads to the input of the low pass filter;
a first feedback network, which connects the output of the first driver stage with the second input of the comparator; and
a second feedback network, which connects the output of the low-pass filter with the second input of the comparator.

The application of first and second feedback networks is especially advantageous. This makes it possible to construct the electronic circuit as a self-oscillating amplifier. For this, the amplifier requires a total feedback network, which, first at a sufficiently high frequency, has 360° phase shift and an amplification of 1 and leads therewith to oscillation. Second, the amplifier requires in the wanted frequency band a phase shift of about 180° and therewith a countercoupling, which acts as an amplifier for the wanted frequencies. The problem for the second requirement is that the low-pass filter leads to a phase shift also for the wanted signal and makes stable control difficult, respectively, in the worst case, even impossible. The first and second feedback networks provide a part of the feedback before the low-pass filter, so that a stable control becomes possible.

In a preferred further development, the first driver stage comprises at least two gates connected in parallel. The parallel connecting of a plurality of gates leads to decreased impedance for the first driver stage and therewith to an increased efficiency.

In an advantageous further development, the electronic circuit includes supplementally at least a second driver stage having an input and an output, wherein the second driver stage is connected between the comparator and the first driver stage, i.e. the output of the comparator leads to the input of the second driver stage, the output of the second driver stage leads to the input of the first driver stage, and wherein the second driver stage includes at least a second push pull end stage.

The introduction of a second driver stage makes it possible to increase the efficiency further.

Preferably, the first driver stage and/or the second driver stage are digital gates. An essential advantage of the use of digital gates as driver stage is that these come equipped with efficient mechanisms for preventing cross currents, which means increased efficiency.

Preferably, the first driver stage and/or the second driver stage are/is embodied in CMOS technology. Through the application of complementary technology with p-channel- and n-channel, field effect transistors, it can be assured that always one transistor blocks while the other conducts. Thus, the efficiency can be further increased. Especially the use of CMOS technology for the first and/or second push pull end stage proves to be especially advantageous.

Preferably, at least one of the inputs of the first and/or second driver stage comprises a Schmitt trigger. A Schmitt trigger transforms slowly alternating signals into clearly defined, jitter free output signals and decreases cross currents effective in the input stages in the supply path.

In a preferred further development, the second driver stage drives a supply voltage smaller than or equal to the supply voltage of the first driver stage.

Preferably, the second driver stage has a smaller driver power than the first driver stage.

Both of the last mentioned means contribute decisively to sinking electrical current consumption and therewith to increasing efficiency.

In a preferred embodiment, the distortion-free operating range of the electronic circuit comprises a limited region, especially 20% to 80% of the supply voltage of the second driver stage.

Advantageously, the first feedback network comprises at least one series resistor. Because of the series resistor, the self-oscillation can be maintained. The series resistor is, moreover, part of a voltage divider for conditioning the input voltage of the comparator.

Preferably, the second feedback network comprises at least one series capacitor and a grounded capacitor.

In a preferred further development, a subcircuit is provided, comprising:

an operational amplifier with a first input, a second input and an output, wherein a connection leads the wanted signal to the second input of the operational amplifier, wherein the output of the operational amplifier leads via at least one resistor to the second feedback network after the grounded capacitor; and a voltage divider connected between the output of the low-pass filter and ground and having a central node, and wherein the central node of the voltage divider leads to the first input of the operational amplifier.

Because of the further development of the electronic circuit with the subcircuit, it is possible to improve load regulation.

Preferably, the first feedback network includes supplementally at least one series capacitor. This serves for DC decoupling of the first feedback network.

In an advantageous further development, the low-pass filter comprises an LC unit.

In an advantageous embodiment, the propagation time of the comparator amounts to 5% to 30% of the reciprocal of the limit frequency of the lowpass filter. Therewith, the system can be so designed that, first of all, the self-oscillation frequency of the system lies far above the limit frequency, so that it is sufficiently removed by the low-pass filter. Second, the electrical current draw of the comparator then decreases the efficiency of the system not too strongly (associated with a lessening of the propagation time is, in practice, always an increasing of the electrical current draw).

Preferably, the electronic circuit is so designed that it drives a power of less than 30 mW.

BRIEF DESCRIPTION OF THE DRAWINGS

The invention will now be explained in greater detail based on the drawing, the figures of which show as follows.

DETAILED DISCUSSION IN CONJUNCTION WITH THE DRAWINGS

Figure 1A:
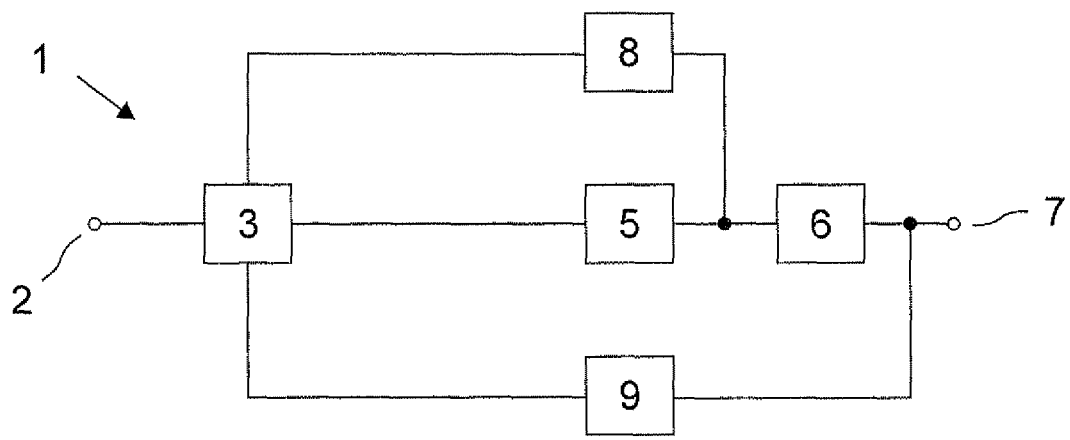
FIG. 1a is a schematic overview of the circuit of the invention in a first embodiment.

In the figures, equal features are provided with equal reference characters.

The circuit of the invention has in its totality the reference character 1. First, the operation of the invention will be explained based on FIG. 1a. Organized based on signal flow, the electronic circuit 1 includes the following components: Signal input 2, comparator 3, first driver stage 5, low-pass filter 6 and signal output 7. The signal is fed back from the output of the first driver stage 5 to the comparator via a first feedback network 8. Furthermore, the signal is fed back from the output of the low-pass filter 6 to the comparator 8 via a second feedback network 9. FIG. 1b shows the circuit of FIG. 1a with an additional, second driver stage 4. The second driver stage 4 is connected between the comparator 3 and the first driver stage 5.

The individual components will now be described in greater detail in the following based on FIG. 2.

The wanted signal is coupled into the first input 3.1 of the comparator 3 via a signal input 2. In given cases, the wanted signal is adjusted via a coupling network with resistors 2.1, 2.2 and 2.3 and corresponding voltage source 2.Vcc, in order that it has the right voltage level for the downstream comparator 3.

The second input 3.2 of the comparator 3 is connected to the first feedback network 8 composed of a resistor 8.1, and to a second feedback network 9 composed of the components capacitor 9.1, capacitor 9.2 and resistor 9.3. The feedback networks 8, 9 are so dimensioned that they form together with the comparator 3 an oscillatory circuit. The principle of the circuit of FIG. 2, respectively FIG. 3, rests on the fact that the oscillation occurs with a variable duty cycle and the length of the duty cycle of the oscillation can be continuously adjusted via variation of the input voltage applied to the first input 3.1 of the comparator 3.

Figure 1B:
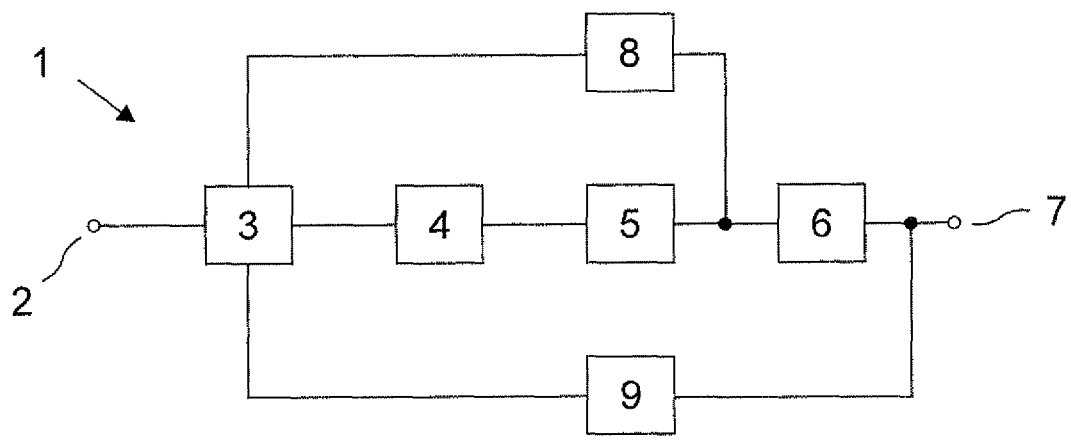
FIG. 1b is a schematic overview of the circuit of the invention in a second embodiment.

As already shown in FIG. 1a, respectively FIG. 1b, options include an individual driver stage or a plurality of driver stages. In the following, the invention will be explained based on a circuit having a first driver stage 5 and a second driver stage 4. By applying a plurality of driver stages, efficiency can be increased further, wherein two driver stages form a good compromise between circuit complexity and efficiency (see also below).

Connected to the output 3.out of the comparator 3 is, first of all, the second driver stage 4. The driver stage 4 includes a push pull end stage and is typically implemented as a CMOS gate driver with Schmitt trigger input and operated with a supply voltage 4.Vcc. Of course, other embodiments of a push pull end stage, for example, in TTL technology, provide other options.

Thus present on the output 4.out of the driver stage 4 is the same logic level as on the output 3.out of the comparator 3.

The output 4.out of the driver stage 4 is connected to the first driver stage 5. Driver stage 5 is implemented in the example as three gates 5.1, 5.2 and 5.3 connected in parallel. The gates 5.1, 5.2 and 5.3 each comprise a push pull end stage and are implemented as inverting CMOS gates with Schmitt trigger input stages. Of course, other embodiments of a push pull end stage can be implemented, for example, in TTL technology. Also, the application of an individual gate, a parallel circuit of only two gates or also yet more gates provide other options.

As mentioned, the first driver stage 5 is implemented as an inverting component. As a result of this, the second driver stage is implemented as a non-inverting gate and the feedback occurs on the non-inverting input of the comparator 3, which is the second input 3.2. Of course, another option is that the first driver stage 5 is non-inverting and the second driver stage 4 inverting. If the two driver stages 4, 5 are equal, i.e. the two are either non-inverting or inverting, then the feedback occurs correspondingly on the inverting input of the comparator, which is the first input 3.1.

Three gates 5.1, 5.2 and 5.3 are used, in order to reduce the impedance with a parallel circuit. The gates 5.1, 5.2 and 5.3 are operated with a supply voltage 5.Vcc. The supply voltage 5.Vcc is advantageously higher than the supply voltage 4.Vcc of the second driver stage 4.

The application of a two-stage driver method has advantages as regards efficiency. Typically, rising edges generated by analog components, such as comparators, are an order of magnitude slower than signal edges of digital components. During a level change on the comparator output 3.out there results, thus, a certain time window, during which the output voltage of the comparator 3 is located in the intermediate region between the two decision thresholds, in the case of which a digital Schmitt trigger input detects a level change. The residence time in the transitional region is shorter, the steeper the edge at the input of the gate is. The residence time in the transitional region on the input of the first driver stage 5 is meaningful for the following reason: So long as the signal level on a digital Schmitt trigger input is located in the transitional region between the switching thresholds, cross currents in the first driver stage 5 inherently cannot be completely prevented. Therefore, the electrical current draw of a digital gate rises significantly for the duration of the presence of the input voltage in the transitional region. The cross currents are, in such case, considerably higher, the higher the supply voltage of the digital gate, and the lower ohm and faster the digital gates are implemented.

If a second driver stage 4 is connected between the first driver stage 5 and the comparator 3, then the cross currents occur on the input only at a single stage and not on three input stages, namely at the input stage of the second driver stage 4.

The cross currents can furthermore be decreased by operating the second driver stage 4 with a lower supply voltage 4.Vcc and by using a CMOS family with lesser driver power and, thus, smaller cross currents than for the first driver stage 5.

Figure 2:
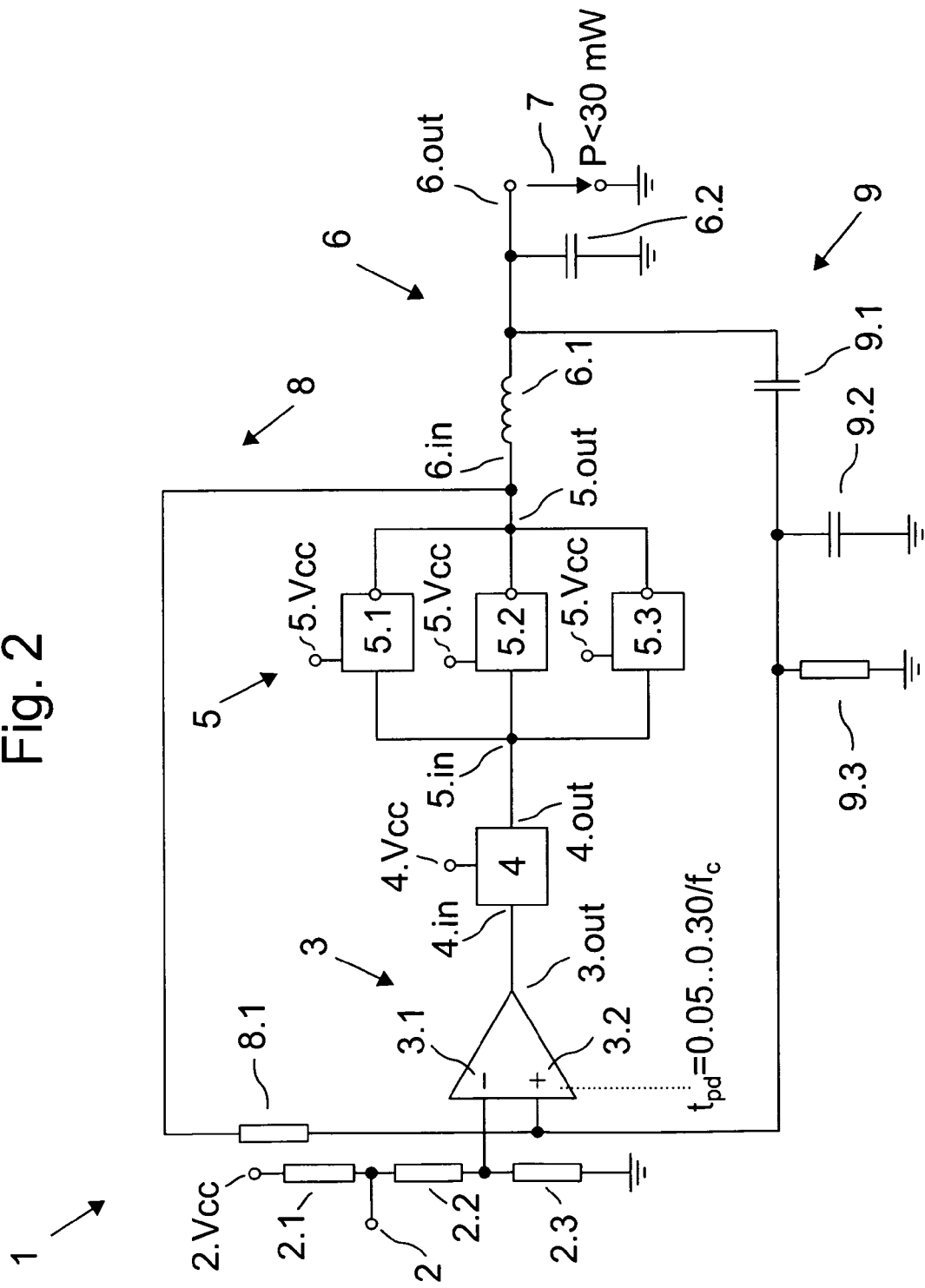
FIG. 2 is the circuit of the invention in the second embodiment.

The oscillatory behavior of the circuit of FIG. 2 results from the following features.

If the voltage level on the first input 3.1 of the comparator 3 subceeds the level on the second input 3.2, then a low level is generated on the output 3.out of the comparator 3. Through the inverting of the first driver stage 5 there results, thus, a high level on the output 5.out. Via the network of resistors 8.1 and 9.3, the capacitor 9.2 is then charged. If the voltage on the capacitor 9.2 reaches the voltage level of the first input 3.1 of the comparator 3, then a level change results on the output 3.out of the comparator 3 and on the output 5.out of the first driver stage 5. The outputs of the first driver stage 5 lie then, as a result, at a low level, which, as a consequence, in turn, leads to a new discharge of the capacitor 9.2.

As a result, this behavior leads to a self-oscillation of the loop, which has the property that the level on the second input 3.2 of the comparator 3 oscillates around the DC level on the first input 3.1.

On the output of the first driver stage 5 there results, thus, a pulse width modulated (PWM) signal. The deciding property of this rectangular signal is that this PWM signal in time average, independently of the supply voltage 5.Vcc of the driver stage 5 and independently of the oscillation frequency, has a constant DC voltage component. This DC voltage component assumes exactly the value, which is required, in order to generate on the voltage divider of the resistances 8.1 and 9.3 the, on average, same voltage, which is placed on the first input 3.1 of the comparator 3.

If one connects to the output 5.out of the first driver stage 5 a low-pass filter 6, composed preferably of a coil 6.1 and a capacitor 6.2, then there is established on the output a direct voltage with exactly this constant value. Instead of the coil 6.1, with the disadvantage of increased power consumption, alternatively also a resistor is an option.

The effective duty cycle on the output 5.out of the first driver stage 5 represents the signal, which is applied to the first input 3.1 of the comparator 3. Correspondingly, there forms also on the output 6.out of the low-pass filter 6 a voltage curve variable as a function of time.

Electronic circuit 1 is so designed that the limit frequency of the low-pass filter 6 lies so low that the residual ripple of the oscillation frequency of the PWM signal is sufficiently suppressed. At the same time, the limit frequency of the low-pass filter 6 must lie sufficiently high that the frequency components fed-in on the first input 3 are not too strongly damped.

The purpose of capacitor 9.1 is to optimize the load regulation of the system. If e.g. a momentary load spike on the output 6.out of the low-pass filter 6 leads to a discharge of the capacitor 6.2, then capacitor 9.1 effects that the voltage on the capacitor 9.2 is decreased and accordingly the duty cycle on the output of the first driver stage 5 is momentarily increased. As a result, a larger electrical current is pumped into the coil 6.1 and the capacitor 6.2 is charged via this supplemental electrical current back to the desired nominal value.

For improving the properties of the electronic circuit 1, its distortion-free operating range is limited. Thus, the voltage on the signal output 7 is, for instance, only, at most, 80% and, at the lowest, 20%, of the supply voltage 5.Vcc of the first driver stage 5.

Figure 3:
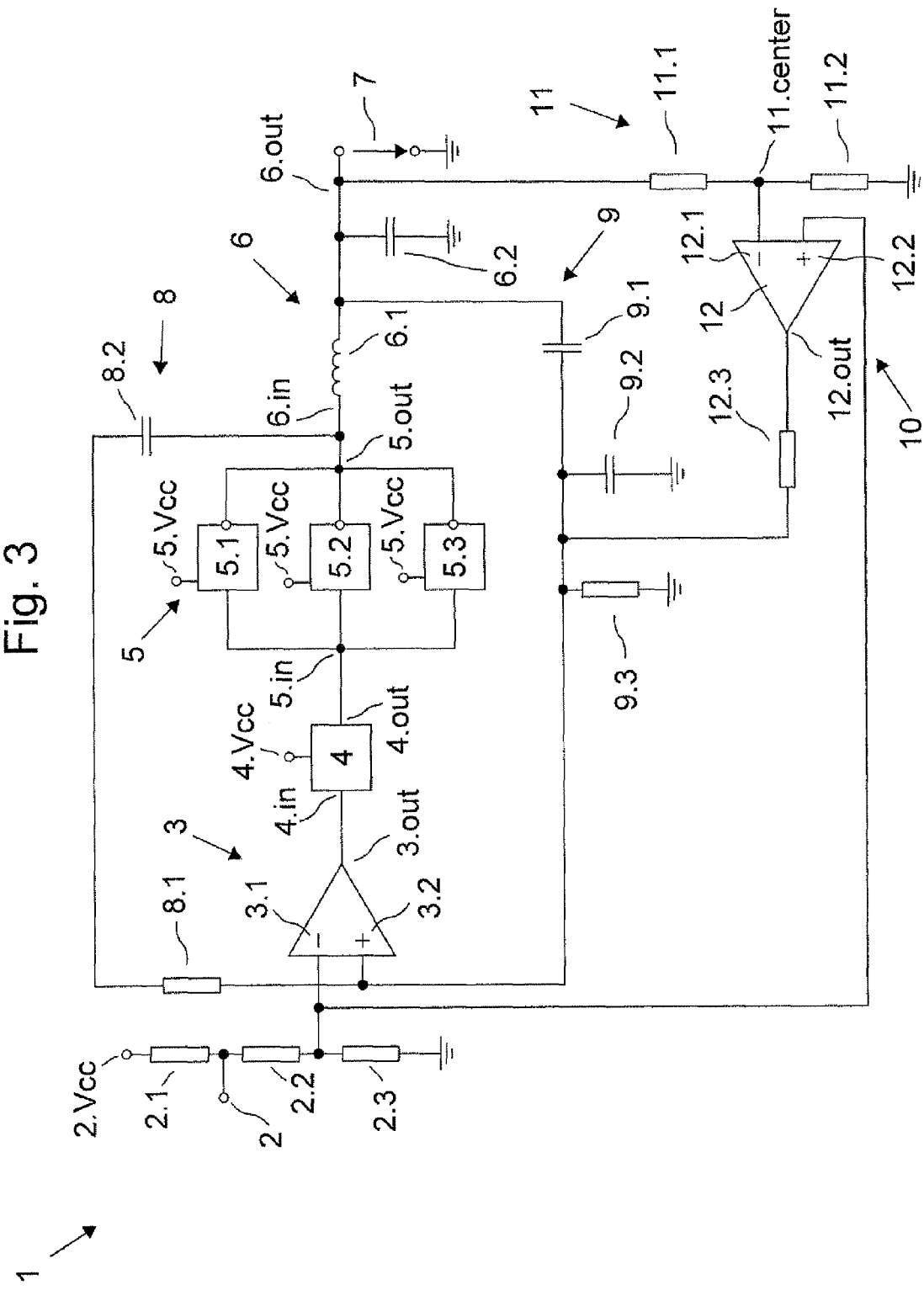
FIG. 3 is the circuit of the invention in a third embodiment.

An embodiment providing improved load regulation is shown in FIG. 3. An operational amplifier 12, which is operated via a voltage divider 11, is added. The center node 11.center of the voltage divider 11 leads, in such case, to the first input 12.1 of the operational amplifier 12. The input signal is fed to the second input 12.2 of the operational amplifier 12. The output 12.out of the operational amplifier 12 is led via a resistor 12.3 to a junction between capacitor 9.2 and resistor 9.3 of the second feedback network 9. The operational amplifier 12 forms, thus, a control amplifier, which assures that the DC level on the output 6.out of the low-pass filter 6 corresponds to the desired voltage. The subcircuit 10 shown in FIG. 3 can, as compensation control, with the additional components, in given cases, compensate voltage drops occurring in the parasitic resistance of the coil 6.1, which could not be compensated in the circuit of FIG. 2, since the DC voltage comparison levels across the resistor 8.1 are tapped at the output 5.1 of the first driver stage 5, and therewith before the coil 6.1.

A further advantage of the topology shown in FIG. 3 is that therewith a two-stage control loop is implemented with a rapidly settling first feedback stage (composed of first and second feedback networks 8 and 9) and a second feedback stage (composed of amplifier 12 and switching network 11). The advantage this two-stage feedback of the switching signals to the comparator input is that, for the second feedback stage, comparatively slow control amplifiers with smaller electrical current draw can be used.

The invention claimed is:

1. A self-oscillating electronic circuit for amplifying a wanted signal in a wanted frequency band, comprising:
   a comparator having a first input, a second input and an output, wherein a connection is provided, which leads the wanted signal to the first input;
   at least a first driver stage comprising an input and an output, wherein the first driver stage includes at least a first push pull end stage, the output of said comparator leads to the input of said first driver stage;
   a low-pass filter having an input and an output, wherein the output of said first driver stage leads to the input of said low pass filter;
   a first feedback network, which connects the output of said first driver stage with the second input of said comparator; and
   a second feedback network, which connects the output of said low-pass filter with the second input of said comparator, wherein:
   said first feedback network and said second feedback network form together with said comparator said self-oscillating electronic circuit,
   said first feedback network and said second feedback form a total feedback network and said total feedback network has 360° phase shift and an amplification of 1,
   amplifying said wanted signal comprises a phase shift of about 180° with a countercoupling, which acts as an amplifier in said wanted frequency band, and
   the first and second feedback networks provide a part of the feedback before the low-pass filter, so that a stable control becomes possible.

2. The electronic circuit as claimed in claim 1, wherein:
   said first driver stage comprises at least two gates connected in parallel.

3. The electronic circuit as claimed in claim 1, further comprising:
   at least a second driver stage having an input and an output, wherein said second driver stage is connected between said comparator and said first driver stage; and
   said second driver stage includes at least a second push pull end stage.

4. The electronic circuit as claimed in claim 1, wherein:
   said first driver stage and/or said second driver stage are digital gates.

5. The electronic circuit as claimed in claim 1, wherein:
   said first driver stage and/or said second driver stage are/is embodied in CMOS technology.

6. The electronic circuit as claimed in claim 1, wherein:
   at least one of the inputs of said first and/or said second driver stage comprises a Schmitt trigger.

7. The electronic circuit as claimed in claim 3, wherein:
   said second driver stage is operated with a supply voltage smaller than or equal to the supply voltage of said first driver stage.

8. The electronic circuit as claimed in claim 3, wherein:
   said second driver stage has a smaller driver power than said first driver stage.

9. The electronic circuit as claimed in claim 1, wherein:
   the distortion-free operating range of the electronic circuit comprises a limited region, of the supply voltage of said second driver stage.

10. The electronic circuit as claimed in claim 1, wherein:
    said first feedback network comprises at least one series resistor.

11. The electronic circuit as claimed in claim 1, wherein:
    said second feedback network comprises at least one series capacitor and a grounded capacitor.

12. The electronic circuit as claimed in claim 1, wherein:
    said first feedback network includes supplementally at least one series capacitor.

13. The electronic circuit as claimed in claim 1, wherein:
    said low-pass filter comprises an LC unit.

14. The electronic circuit as claimed in claim 1, wherein:
    the propagation time of said comparator amounts to 5% to 30% of the reciprocal of the limit frequency of said low-pass filter.

15. The electronic circuit as claimed in claim 1, wherein:
    the electronic circuit is so designed that it drives a power of less than 30 mW.

16. The electronic circuit for amplifying a wanted signal, comprising:
    a comparator having a first input, a second input and an output, wherein a connection is provided, which leads the wanted signal to the first input;
    at least a first driver stage comprising an input and an output, wherein the first driver stage includes at least a first push pull end stage, the output of said comparator leads to the input of said first driver stage;
    a low-pass filter having an input and an output, wherein the output of said first driver stage leads to the input of said low pass filter;
    a first feedback network, which connects the output of said first driver stage with the second input of said comparator;
    a second feedback network, which connects the output of said low-pass filter with the second input of said comparator, and a subcircuit, comprising:
an operational amplifier with a first input, a second input and an output, wherein a connection leads the wanted signal to said second input of said operational amplifier, and
the output of said operational amplifier leads via at least one resistor to said second feedback network after the grounded capacitor; and
a voltage divider connected between the output of said low-pass filter and ground and having a center node,
wherein said center node of said voltage divider leads to said first input of said operational amplifier.

17. A self-oscillating electronic circuit for amplifying a wanted signal, comprising:
a comparator having a first input, a second input and an output, wherein a connection is provided, which leads the wanted signal to the first input;
at least a first drive stage comprising an input and an output, wherein the first driver stage includes at least a first push pull end stage, the output of said comparator leads to the input of said first driver stage;
a low-pass filter having an input and an output, wherein the output of said first driver stage leads to the input of said low pass filter;
a first feedback network, which connects the output of said first driver stage with the second input of said comparator;
a second feedback network, which connects the output of said low-pass filter with the second input of said comparator; and
a subcircuit comprising: an operational amplifier with a first input, a second input and an output, wherein a connection leads the wanted signal to said second input of said operational amplifier; and the output of said operational amplifier leads via at least one resistor to said second feedback network after the grounded capacitor; and a voltage divider connected between the output of said low-pass filter and ground and having a centernode, wherein:
said center node of said voltage divider leads to said first input of said operational amplifier; and said first feedback network and said second feedback network form together with said comparator said self-oscillating circuit.

\* \* \* \* \*